US007769071B2

(12) United States Patent
Vahala et al.

(10) Patent No.: US 7,769,071 B2
(45) Date of Patent: Aug. 3, 2010

(54) SILICA SOL GEL MICRO-LASER ON A SUBSTRATE

(75) Inventors: Kerry J. Vahala, San Gabriel, CA (US); Lan Yang, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 341 days.

(21) Appl. No.: 10/985,593

(22) Filed: Nov. 9, 2004

(65) Prior Publication Data

US 2005/0169331 A1  Aug. 4, 2005

Related U.S. Application Data

(60) Provisional application No. 60/541,110, filed on Feb. 2, 2004.

(51) Int. Cl.
*H01S 3/08* (2006.01)
(52) U.S. Cl. .............................. 372/92; 372/94; 372/67; 372/19
(58) Field of Classification Search .................... 372/15, 372/92, 39, 66, 43, 44, 45, 50, 67
See application file for complete search history.

(56) References Cited

U.S. PATENT DOCUMENTS

| 3,589,794 | A | | 6/1971 | Marcatili |
| 3,760,297 | A | | 9/1973 | Thompson |
| 3,913,126 | A | * | 10/1975 | Hooker et al. ............... 257/634 |
| 4,282,499 | A | | 8/1981 | DeFonzo |
| 4,695,121 | A | | 9/1987 | Mahapatra et al. |
| 5,114,738 | A | | 5/1992 | Savage et al. |

(Continued)

FOREIGN PATENT DOCUMENTS

FR  2 703 473   10/1994

(Continued)

OTHER PUBLICATIONS

Gayral, B. et al, "High-Q wet-etched GaAs microdisks containing InAs quantum boxes." Applied Physics Letters vol. 75, No. 13, pp. 1908-1910.*

(Continued)

*Primary Examiner*—Minsun Harvey
*Assistant Examiner*—Patrick Stafford
(74) *Attorney, Agent, or Firm*—Connolly Bove Lodge & Hutz LLP (57) ABSTRACT

Silica sol gel micro-lasers and methods of fabricating micro-lasers on a chip or a wafer. A silica sol gel micro-laser includes a silica sol gel optical micro-cavity, a substrate, and a support member or pillar that extends between the micro-cavity and the substrate. An outer surface or periphery of the micro-cavity extends beyond a top of the sol gel support member or is overhanging with respect to the underlying support member. Optical energy travels along an inner surface of the silica sol gel micro-cavity. Undoped silica sol gel micro-cavities can be used for Raman lasers. Sol gel micro-cavities can be doped with, for example, erbium, and can be used for erbium-doped micro-lasers that have ultra narrow line widths, for example, less than 100 Hz. Undoped and doped silica sol gel micro-lasers can have Q factors greater than $10^7$.

47 Claims, 11 Drawing Sheets

(a) solgel silica on silicon substrate (b) solgel silica disks on silicon substrate (c) Undercut silica disks on silicon substrate after $XeF_2$ isotropic silicon etch (d) microtoroid structure after $CO_2$ laser reflow

U.S. PATENT DOCUMENTS

| | | | |
|---|---|---|---|
| 5,222,092 A * | 6/1993 | Hench et al. | 372/53 |
| 5,240,488 A | 8/1993 | Chandross | |
| 5,343,490 A * | 8/1994 | McCall | 372/94 |
| 5,651,022 A * | 7/1997 | Anthon et al. | 372/92 |
| 5,825,799 A | 10/1998 | Ho et al. | |
| 5,878,070 A | 3/1999 | Ho et al. | |
| 6,052,495 A | 4/2000 | Little et al. | |
| 6,078,605 A | 6/2000 | Little et al. | |
| 6,101,300 A | 8/2000 | Fan et al. | |
| 6,222,964 B1 | 4/2001 | Sadot et al. | |
| 6,259,717 B1 * | 7/2001 | Stone et al. | 372/92 |
| 6,467,312 B1 | 10/2002 | De Hazen et al. | |
| 6,741,628 B2 | 5/2004 | Painter et al. | |
| 6,751,241 B2 * | 6/2004 | Davis et al. | 372/6 |
| 6,901,101 B2 * | 5/2005 | Frick | 372/92 |
| 7,545,843 B2 * | 6/2009 | Armani et al. | 372/92 |
| 2002/0018611 A1 * | 2/2002 | Maleki et al. | 385/15 |
| 2003/0021518 A1 | 1/2003 | Simimov et al. | |
| 2003/0179981 A1 | 9/2003 | Lee et al. | |
| 2004/0179573 A1 | 9/2004 | Armani et al. | |

FOREIGN PATENT DOCUMENTS

| | | |
|---|---|---|
| JP | 05203826 A | 8/1993 |
| WO | WO 98/05995 | 2/1998 |

OTHER PUBLICATIONS

Gerard, J.M., et al. "Quantum boxes as active probes for photonic microstructures: The pillar microcavity case" *Applied Physics Letters* 69, 449-451 (1996).
Gorodetsky, M. L., et al. "Ultimate Q of optical microsphere resonators" *Optics Letters* 21, 453-455 (1996).
Vernooy, D. W., et al. "High-Q measurements of fused-silica microspheres in the near infrared" *Optics Letters* 23, 247-249 (1998).
Cai, M., et al., "Observation of critical coupling in a fiber taper to a silica- microsphere whispering-gallery mode system" *Physical Review Letters* 85, 74-77 (2000).
Spillane, S. M., et al., "Ultralow-threshold Raman laser using a spherical dielectric microcavity" *Nature* 415, 621-623 (2002).
Gayral, B. et al., "High-Q wet-etched GaAs microdisks containing InAs quantum boxes" *Applied Physics Letters* 75, 1908-1910 (1999).
Michler, P. et al., "Quantum dot lasers using high-Q microdisk cavities" *Physica Status Solidi B-Basic Research* 224, 797-801 (2001).
Cai, M., et al., "Fiber-coupled microsphere laser" *Optics Letters* 25, 1430-1432 (2000).
McCall, S. L., et al., "Whispering-Gallery Mode Microdisk Lasers" *Applied Physics Letters* 60, 289-291 (1992).
Sandoghdar, V., et al., "Very low threshold whispering-gallery-mode microsphere laser" *Physical Review A* 54, R1777-R1780 (1996).
Djordjev, K., et al., "Microdisk tunable resonant filters and switches" *Ieee Photonics Technology Letters* 14, 828-830 (2002).
Rabiei Payam, W. H. S., et al., "Polymer Micro-Ring Filters and Modulators" *Journal of Lightwave Technology* 20, 1968-1975 (2002).
Djordjev, K., Choi, et al., "Vertically coupled InP microdisk switching devices with electroabsorptive active regions" *Ieee Photonics Technology Letters* 14, 1115-117 (2002).
Yariv, A. "Critical coupling and its control in optical waveguide-ring resonator systems" *Ieee Photonics Technology Letters* 14, 483-485 (2002).
Soref, R. A., et al., "Proposed N-wavelength M-fiber WDM cross connect switch using active microring resonators" *Ieee Photonics Technology Letters* 10, 1121-1123 (1998).
Chu, S. T., et al., "An eight-channel add-drop filter using vertically coupled microring resonators over a cross grid" *Ieee Photonics Technology Letters* 11, 691-693 (1999).
Little, B. E., et al., "Vertically coupled glass microring resonator channel dropping filters" *Ieee Photonics Technology Letters* 11, 215-217 (1999).
Offrein, B. J., et al.., "Resonant coupler-based tunable add-after-drop filter in silicon-oxynitride technology for WDM networks" *Ieee Journal of Selected Topics in Quantum Electronics* 5, 1400-1406 (1999).
Little, B. E., et al., "Microring resonator channel dropping filters" *Journal of Lightwave Technology* 15, 998-1005 (1997).
Grover, R., et al., "Parallel-cascaded semiconductor microring resonators for high- order and wide-FSR filters" *Journal of Lightwave Technology* 20, 872-877 (2002).
Yanagase, Y., et al., "Box-like filter response and expansion of FSR by a vertically triple coupled microring resonator filter" *Journal of Lightwave Technology* 20, 1525-1529 (2002).
Krioukov, E., et al., "Sensor based on an integrated optical microcavity" *Optics Letters* 27, 512-514 (2002).
Vollmer, F., et al., "Protein detection by optical shift of a resonant microcavity".
Bumki, M., et al., "Compact, fiber-compatible, cascaded Raman laser" *Optics Letters*, vol. 28, No. 17, Sep. 2003.
Kleppner, D., "Inhibited Spontaneous Emission" *Physical Review Letters* 47, 233-236 (1981).
Yang, L., et al., "Fiber-coupled Erbium Microlasers on a chip" *Applied Physics Letters*, vol. 83, No. 5, 825-826, Aug. 2003.
Kippenberg, S. M., et al., "Fabrication and coupling to planar high-Q silica disk microcavities" *Applied Physics Letters*, vol. 83, No. 4, 797-799, Jul. 2003.
Yang, L., et al., "Gain functionalization of silica microresonators".
Schiller, S., et al., "Fused -silica monolithic total-internal-reflection resonator" *Optics Letters*, vol. 17, No. 5, 378-380 Mar. 1992.
Knight, J.C., "Phase-matched excitation of whispering-gallery-mode resonances by a fiber taper" *Optics Letters*, vol. 22, No. 15, 1129-131 Aug. 1997.
Yariv, A., "Universal relations for coupling of optical power between microresonators and dielectric waveguides" *Electronics Letters*, vol. 36, No. 4, 321-322 Feb. 2000.
Little, B.E., et al., "Wavelength Switching and Routing Using Absorption and Resonance" *IEEE Photonics Technology Letters*, vol. 10, No. 6, 816-818 Jun. 1998.
Huang, W., et al., "Sol-Gel Silica-on-Silicon Buried-Channel EDWAs", *Journal of Lightwave Technology*, vol. 21, No. 5, 1339-1349 May 2003.
Chu, D., et al., "Observation of Enhanced Photoluminescence in Erbium-Doped Semiconductor Microdisk Resonator", *Applied Physics Letters*, 1995, vol. 66, No. 21, pp. 2843-2845.
Kawachi, M., "Silica Waveguides on Silicon and Their Application to Integrated-Optic Components", *Optical and Quantum Electronics*, 1990, vol. 22, pp. 391-416.
Von Klitzing, W., et al., "Tunable Whispering Gallery Modes for Spectroscopy and CQED Experiments", *New Journal of Physics*, 2001, vol. 3, pp. 14.1-14.4.
Chan, I. W. T., "Gas Phase Pulse Etching of Silicon for MEMS with Xenon Difluoride", IEEE, 1999, pp. 1637-1642.
Armani, D., et al., "Ultra-high-Q toroid microcavity on a chip", *Nature*, vol. 421, pp. 925-927 (Feb. 27, 2003).
Chin, M., et al., "Design and Modeling of Waveguide-Coupled Single-Mode Micoring Resonators", *Journal of Lightwave Technology*, vol. 1, No. 8, pp. 1433-1446 (1998).
Office Action mailed on Oct. 19, 2007 in the matter of U.S. Appl. No. 10/678,354.
Notice of Allowance mailed on Feb. 27, 2009 in the matter of U.S. Appl. No. 10/678,354.

* cited by examiner

Figure 1

Photomicrograph plan view after each process step. (a) solgel silica circular pads with diameter of 100 μm after wet etching; (b) undercut microdisk with diameter of 100 μm after dry etching; (c) microtoroid after $CO_2$ laser reflow.

SILICA SOL GEL MICRO-LASER ON A SUBSTRATE

CROSS-REFERENCE TO RELATED APPLICATION

This application claims priority under 35 U.S.C. §119 to U.S. Provisional Patent Application No. 60/541,110, filed Feb. 2, 2004, the entire disclosure of which is incorporated herein by reference, as though set forth in full.

STATEMENT REGARDING FEDERALLY SPONSORED RESEARCH

The U.S. Government has certain rights in this invention pursuant to Grant No. N00014-00-1-0650 awarded by the Office of Naval Research and Grant No. DMR-0103134 awarded by the National Science Foundation.

FIELD OF THE INVENTION

The present invention relates to micro-cavity resonators or micro-lasers, more particularly, to silica sol gel micro-cavity resonators and methods of fabrication.

BACKGROUND OF THE INVENTION

Various micro-cavity resonators or micro-lasers have been utilized to re-circulate light and store optical power. In a typical micro-cavity resonator, light traverses around an interior surface of the cavity. The optical power stored in the resonator can be used in cavity quantum electrodynamics (cQED), photonics, and various optics applications.

Known micro-cavities include surface tension induced micro-cavities (STIM), such as droplets or micro-spheres. The surface quality or finish of a resonator usually affects how long light can re-circulate in the resonator. For example, STIM silica micro-spheres typically have smooth surfaces to allow light energy to be stored for relatively long periods of time and provide a high Q factor or Q value. The Q factor is known as $1/Q=1/Q(scat)+1/Q(mat)$, where Q(scat) approximates surface scattering and Q(mat) approximates material loss. The Q factor measures the stability of light within a resonator. In other words, the Q value measures the relationship between stored energy and the rate of dissipation of the energy in the resonator.

Some known micro-cavity resonators have made improvements in attaining improved Q factors. However, challenges remain with integrating such devices on a chip or silicon substrate. For example, spherical micro-resonators are difficult to integrate with planar silicon substrates as a result of their shape.

Additionally, silica micro-resonators that are made on a silicon substrate may present certain processing and integration challenges. Silica micro-resonators may be one of multiple components on a silicon substrate or chip. As part of processing the surfaces of the silica micro-resonators, the silica micro-resonators are heated and re-flowed. If the resonators are not selectively heated, then the entire chip with the silica micro-resonators and other components is typically batch processed and placed in a furnace in order to treat the silica. Furnace temperatures of about 1700° C. are used to melt or reflow silica of the micro-resonator. Thus, the other chip components and materials are exposed to the same heating temperatures and durations, including the underlying silicon substrate, which has a lower melting point of about 1400° C. Consequently, the silicon substrate may melt at temperatures that are used to process silica micro-resonators, causing the silica micro-resonator structure to fall or be damaged due to the instability of the underlying melted silicon.

The known techniques for doping micro-cavities can also be improved. For example, one conventional doping technique is ion implantation. Ion implantation involves implanting ions, for example, erbium ions, into a surface or certain thickness of a micro-cavity. Known implementation techniques, however, are typically expensive and ineffective since they implant a dopant on a surface or down to a limited depth of the micro-cavity. In other words, the dopant is applied to a fraction of the micro-cavity surface or body and is not homogenously mixed throughout the micro-cavity body. Consequently, the implanted ions have a limited impact since they may only interact with a fraction of the optical energy stored in the resonator.

The doping process can also be improved by making the micro-cavity of a material to which dopants can be readily added. For example, sol gel materials are examples of such materials that can host various dopants. Sol gel materials have been used to form resonators, but with unacceptable results, for example, low Q factors. Sol gel materials have also been utilized to make waveguide materials. For example, one known planar sol gel waveguide device is an erbium-doped waveguide amplifier (EDWA), described in "Sol Gel Silica-on-Silicon Buried-Channel EDWAs, by W. Huang et al. This reference describes fabricating complete buried-channel-guide EDWAs in silica-on-silicon using sol-gel precursors and having multiple layers, and doping the sol gel waveguides.

Accordingly, there exists a need for a process and a micro-cavity structure that is fabricated directly on a substrate including, without limitation, a silicon substrate or a chip, that can be easily and inexpensively integrated and processed with other chip components. Such structure should also be readily doped using an effective host, such as silica sol gel. The resulting structure includes micro-lasers which can operate at useful wavelengths and have narrow line widths to provide accurate control of the devices for use as, for example, laser sources for heterodyne detection. Resonator structures of the present invention should also be prepared in such a manner that they support high and ultra high Q values. Further, it should also be possible to selectively heat resonators or heat the desired structure on a substrate in a furnace without damaging the underlying substrate.

SUMMARY

In accordance with one embodiment, a sol gel micro-cavity resonator includes a sol gel micro-cavity, a substrate and a support member for the sol gel micro-cavity. In a preferred embodiment, the support member extends between the sol gel micro-cavity and the substrate, and an outer surface or periphery of the sol gel micro-cavity extends beyond a top of the support member. Optical energy travels along an inner surface of the sol gel micro-cavity.

In an alternative embodiment, an ultra narrow line width micro-laser on a substrate, such as a chip or a wafer, includes an optical micro-cavity that includes a dopant, a silicon substrate and a support for the doped optical micro-cavity. The support member extends between the doped optical micro-cavity and the silicon substrate. Optical energy travels along an inner surface of the doped optical micro-cavity and has a line width less than 1000 Hz.

In a further embodiment, a method of forming a micro-cavity resonator on a substrate, such as a chip or a wafer, includes providing a substrate, applying a coating of a solution to the substrate, forming an optical coating, forming an optical micro-cavity from the optical coating, and forming a support member from the substrate. The support member extends between the optical micro-cavity and the substrate, and an outer surface or periphery of the optical micro-cavity extends beyond a top of the support member. Optical energy traveling along an inner surface of the optical micro-cavity.

In a further alternative embodiment, is a method of making an ultra narrow line width micro-laser on a substrate, such as a chip or a wafer. The method includes providing a substrate and a doped solution, applying a coating of the doped solution to the substrate, forming an optical coating, forming a doped optical micro-cavity from the optical coating and forming a support member from the substrate. The support member extends between the optical micro-cavity and the substrate, and optical energy travels along an inner surface of the doped optical micro-cavity and has a line width less than 1000 Hz.

Other aspects of silica sol gel micro-lasers and methods of fabricating micro-lasers will become apparent from consideration of the following description taken in conjunction with the accompanying drawings.

BRIEF DESCRIPTION OF THE DRAWINGS

Referring now to the drawings, in which like reference numbers represent corresponding parts throughout, and in which.

DETAILED DESCRIPTION OF ILLUSTRATED EMBODIMENTS

This specification describes embodiments of sol gel micro-lasers, such as silica sol gel micro-lasers, using undoped and doped sol gel solutions, and methods for making such micro-lasers. In the following description, reference is made to the accompanying drawings, which show by way of illustration, but not limitation, specific embodiments that can be utilized.

Figure 1:
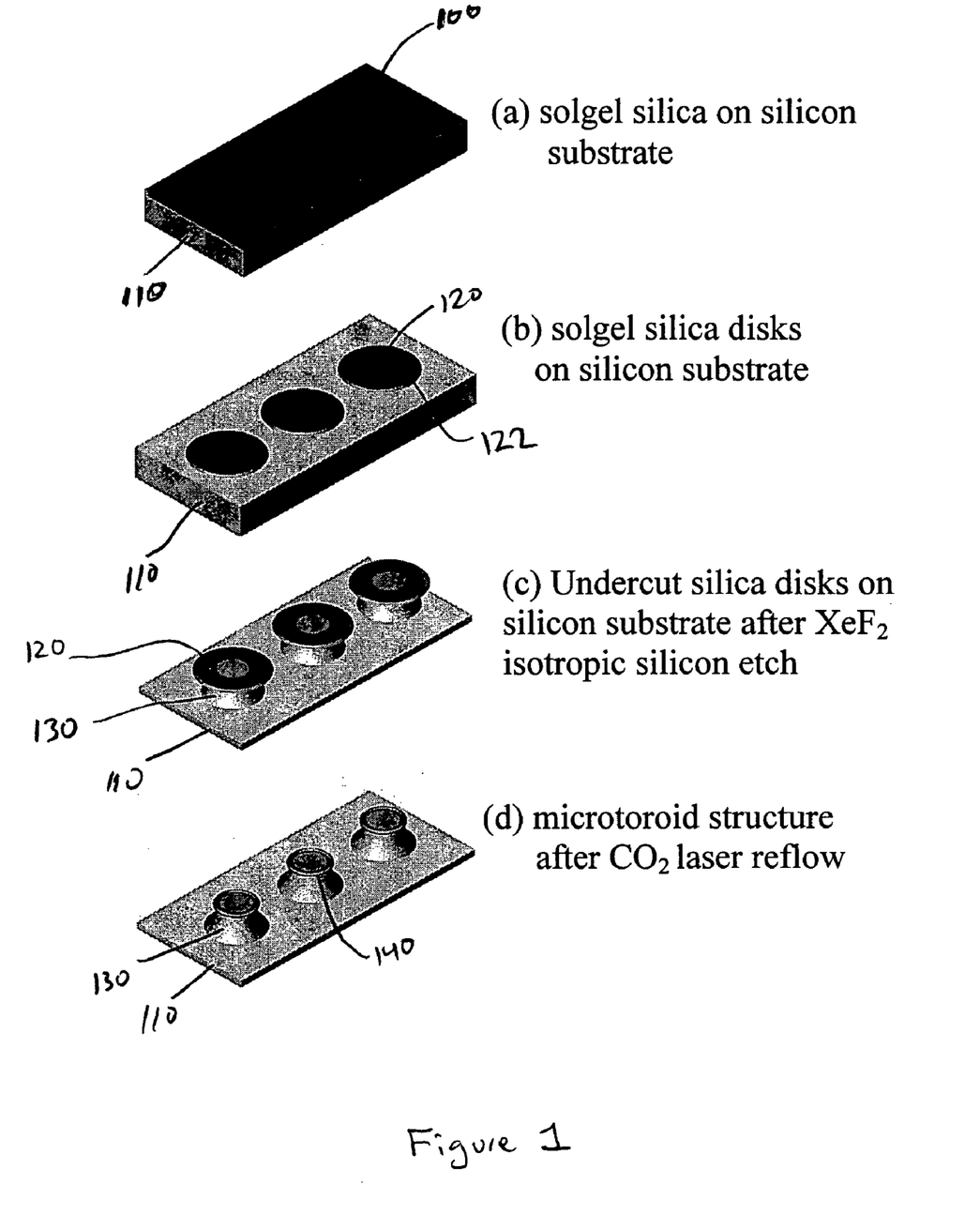
FIG. 1 is a system flow diagram illustrating preparation of silica sol gel micro-lasers directly form a silica sol gel coating on a substrate.
Figure 2:
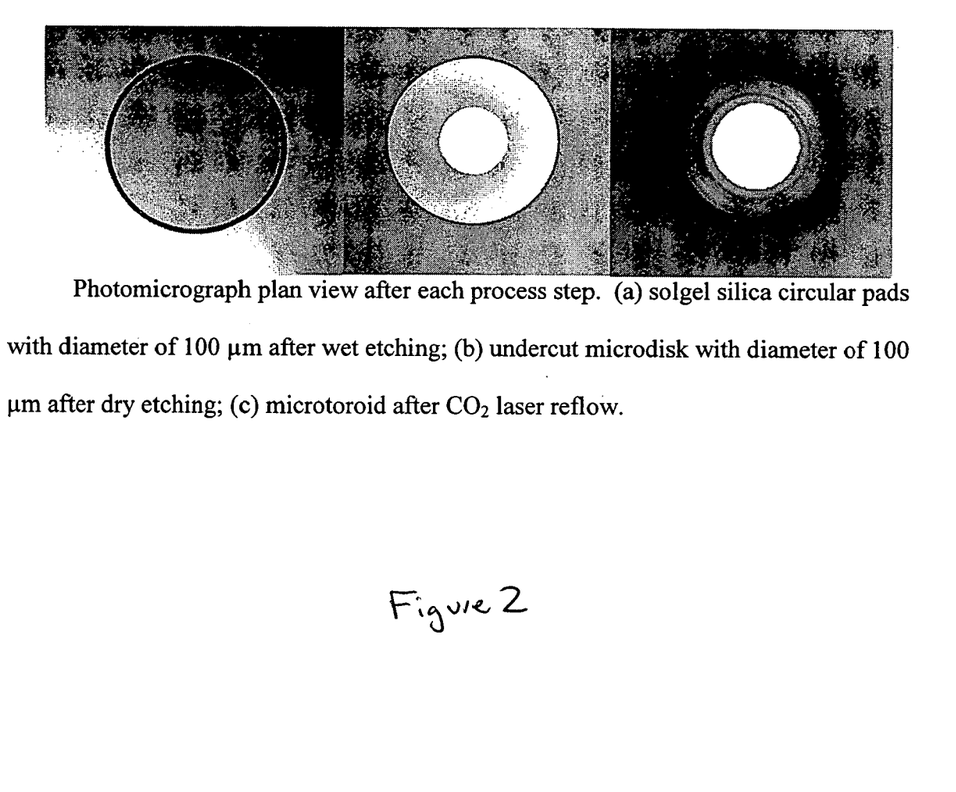
FIG. 2 is a system flow diagram showing top views of structures after processing steps shown in FIG. 1.

Referring to FIGS. 1 and 2, a silica sol gel solution 100 is applied to a substrate 110, such as a silicon substrate, a wafer or a chip, in order to form a silica sol gel coating. While other substrates can be utilized with various embodiments. This specification generally refers to a silicon substrate for purposes of explanation, but not limitation.

An etching process is used to form or shape silica sol gel disks 120 from the coating on the substrate 110. After the silica sol gel disks 120 are formed, the silicon substrate 110 is etched. As shown in FIG. 1, sections of the silicon substrate 110 underneath an outer periphery 122 of the silica sol gel disks 120 are etched, resulting in a substrate 110, a silica sol gel micro-cavity 120, and a support member or pillar 130 extending between the substrate 110 and the micro-cavity 120. A heat source, such as a $CO_2$ laser, is applied to sections or all of an outer periphery 122 of the silica sol gel micro-cavity 120 in order to reflow and densify the silica sol gel. The re-flowed silica sol gel adheres to itself and forms a toroid-shaped sol gel micro-cavity 140 that is suspended above the substrate 110 by the support member 130.

If a dopant is utilized, the dopant is mixed with the solution 100 forming the coating. As a result, the dopant is dispersed throughout the sol gel micro-cavity, in contrast to conventional implantation techniques, which implant ions in limited sections of a micro-cavity. These and other aspects of embodiments are described in further detail with reference to FIGS. 3-10.

Figure 3:
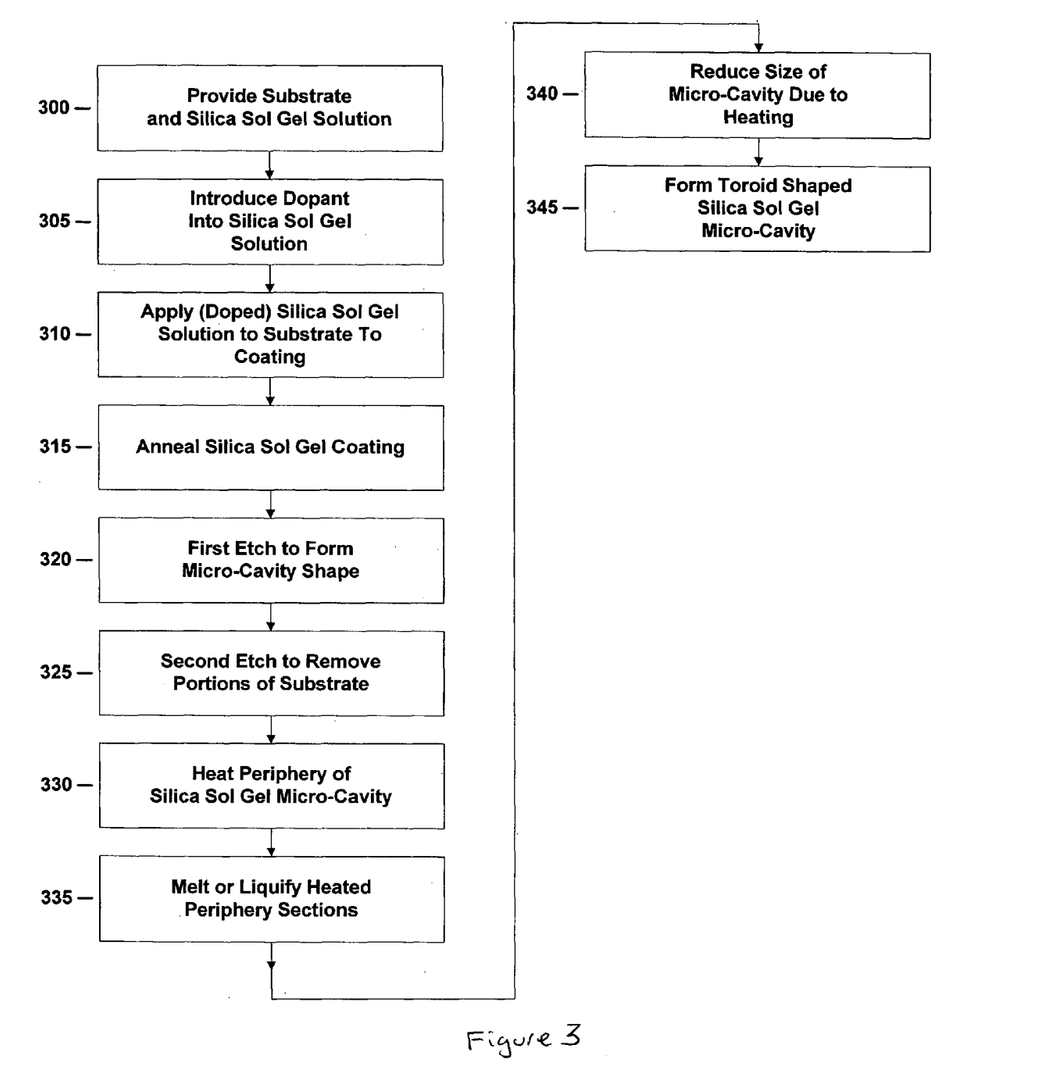
FIG. 3 is a flow diagram illustrating preparation of silica sol gel micro-lasers directly from a sol gel coating on a substrate.

FIG. 3 illustrates the previously described processing steps in further detail. In step 300, a substrate, such as a silicon substrate, a wafer or a chip, and a silica sol solution are provided. In step 305, if necessary, a dopant is introduced into the silica sol gel solution. A dopant may not be necessary if a Raman laser is to be prepared, whereas a dopant would be utilized if a doped micro-laser, such as an erbium-doped micro-laser is being prepared.

Dopant(s) may be used for different purposes. For example, a dopant can provide certain optical functionality or wavelength emissions. A dopant can also be utilized to reduce a melting point of a silica sol gel micro-cavity so that the silica sol gel micro-cavity has a lower melting point that the underlying silicon substrate and support member, thereby allowing batch processing of silica sol gel micro-resonators on a silicon substrate in a furnace. The dopant will be one or more rare earth elements, such as erbium, Nd, Yb, or a combination of Er/Yb, an organic element.

In step 310, the silica sol gel solution (or doped silica sol gel solution) is applied to the substrate to form an optical coating on the substrate. For example, in one embodiment, the solution is applied by spin-coating the solution onto the substrate. Spin coating can be used to apply one or multiple layers of the silica sol gel solution and form an optical coating having various thicknesses. For example, spin-coating can be performed at a rate of about 2,500-4,000 revolutions per minute (rpm), preferably about 3000 rpm, for a duration of about 30-60 seconds, preferably about 45 seconds. With these spin-coating parameters, a silica sol gel coating having a thickness of about one-half micrometer can be formed on the substrate. In step 315, the coated substrate is annealed, for example, by exposing the coated substrate to $O_2$ at a temperature of about 900° C. to about 1100° C., preferably about 1000° C., for about 2 to 5 hours, preferably about three hours.

In step 320, the optical coating is etched to form one or more micro-cavities. For example, a layer of photoresist is applied to the sol gel coated wafer, and a mask with circular pads is applied over the photoresist layer, such as Shipley S-1813 photoresist, covering the sol gel coated substrate. Photoresist sections are exposed to ultraviolet (UV) light through the mask. Photoresist sections underneath the circular pads of the mask are not exposed to UV light. Other sections of photoresist that are exposed to UV are washed out with, for example, developer Shipley MF 319, or another suitable photoresist developer. The photoresist circular pads serve as an etch mask during a wet etching process which uses a hydrogen fluoride (HF) solution, or other suitable etch solution as in known to persons skilled in the art. Acetone is then used to remove residual photoresist. Thus, the etching process leaves a series of circular silica sol gel pads on a wafer, in the shape of a micro-cavity. In step 325, portions of the silicon substrate are etched, thereby forming a pillar or support member between the silica sol gel micro-cavity and the silicon substrate. As a result, an outer periphery of the sol gel micro-cavity extends beyond a top of the support member, which supports the silica sol gel micro-cavity above. In other words, the sol gel micro-cavity is an overhanging structure relative to the underlying support member or pillar.

More particularly, in one embodiment, the silicon substrate is exposed to a second etchant, such as xenon difluoride ($XeF_2$) gas. The $XeF_2$ gas can be at a pressure of about 3 Torr. The $XeF_2$ gas removes portions of the silicon base beneath the periphery of the silica sol gel micro-cavity. As a result, portions of the silicon substrate are removed by the $XeF_2$ gas, and the remaining portions of the silicon substrate form a support member or pillar that is generally perpendicular to the silica sol gel micro-cavity and the substrate. Thus, in the illustrated embodiment, the silica sol gel micro-cavity is substantially parallel to the top of the support member since the $XeF_2$ gas isotropically etches the support member, but not the sol gel micro-cavity. As shown in FIG. 1, the $XeF_2$ gas isotropically removes silicon so that the periphery of the silica disk is equally undercut, leaving a tapered silicon pillar or substrate that supports the larger undercut silica sol gel micro-cavity. Thus, the substrate and the support member are made of the same material, e.g., silicon.

Thus, the outer edges of the silica sol gel micro-cavity extend around the outer portion of the top surface of the silicon pillar. For example, a top of the support member can have a diameter of about 10 to about 60 µm, and the outer diameter of the silica sol gel micro-cavity can have a diameter of about 30 to about 100 µm. Thus, the outer periphery of the silica sol gel micro-cavity can extend beyond the top of the support member by about 10 to about 40 µm. Removing the higher index silicon from the silicon substrate also serves to inhibit power leakage from the silica sol gel micro-resonator into the silicon substrate.

In step 330, a portion or all of a periphery of the optical sol gel micro-cavity is heated, causing the heated periphery sections to liquefy and reflow. For example, a laser, such as an Excimer or $CO_2$ laser, is selectively applied to the undercut periphery of the silica sol gel disk.

As a result of the laser illumination, in step 335, the heated periphery sections are melted or partially or completely liquefied. In step 340, as the molten silica sol gel micro-cavity is heated, the diameter of the silica sol gel structure becomes smaller which, in turn, reduces the effective cross-section of the disk that is available to absorb power from the laser.

In step 345, molten silica sol gel shrinks or collapses and adheres to itself due to the surface tension of the silica sol gel material and eventually stabilizes into a toroid-shaped silica micro-cavity. For example, the initial diameter of the silica sol gel disk can be from about 30 to about 100 µm, and the final or terminal outer diameter of the silica sol gel micro-cavity can be from about 20 µm to about 80 µm. Thus, the micro-cavity is "self-quenching" when heated and assumes a toroid shape as a stable state.

The time required for the molten silica sol gel to assume the toroid-like shape can vary depending on, for example, the size of the silica sol gel micro-cavity and the amount and duration of laser radiation. During laser heating, the silicon pillar remains significantly cooler and physically unaffected throughout the silica sol gel reflow process, serving as a heat sink to selectively absorb and dissipate the heat generated by the reflow process. This is due to silicon having a weaker optical absorption than silica sol gel at 10.6 microns. Silicon is also about 100 times more thermally conductive than silica sol gel. The final diameter of the sol gel micro-cavity can also be further controlled by additional lithography and chemical etch steps, as needed.

Figure 4A:
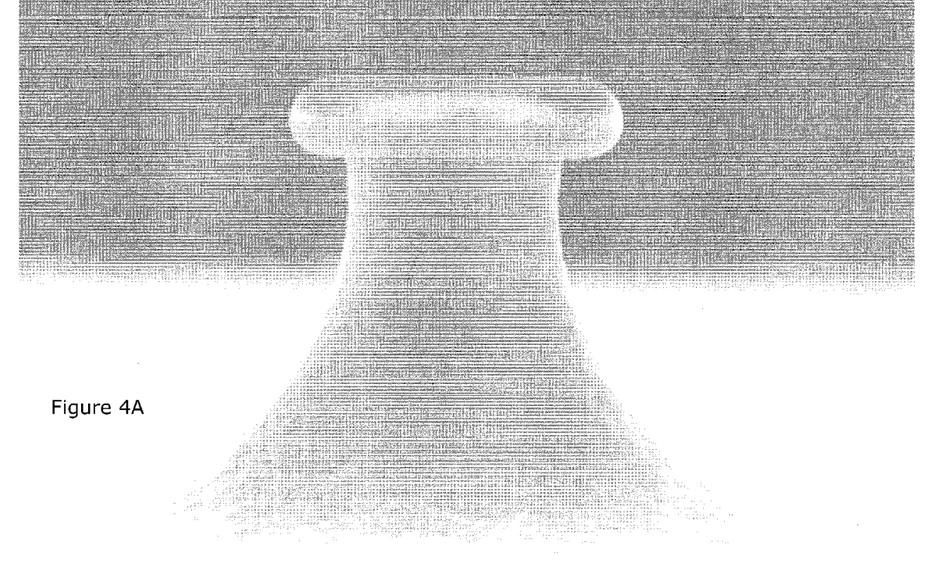
FIG. 4A is a side view of a silica sol gel micro-resonator and a support member extending between a silica sol gel micro-resonator and a substrate.
Figure 4B:
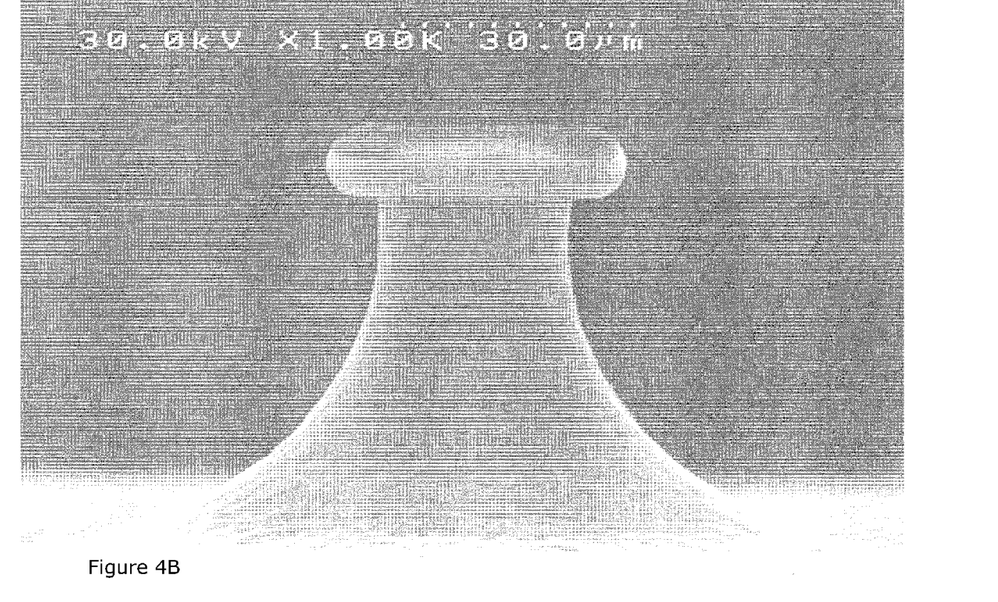
FIG. 4B is a side view of another silica sol gel micro-resonator and a support member extending between the silica sol gel micro-resonator and a substrate.

Referring to FIGS. 4A-B, in the illustrated embodiments, the silica sol gel micro-cavity 110 has a generally toroid or doughnut-like shape. One or more silica sol gel micro-cavity resonators can be integrated with other chip components since they have a silicon substrate and planar structure that can be coupled to other components. In one embodiment, the silica sol gel toroid has a thickness of about 5-10 µm. Persons skilled in the art will recognize that micro-cavity resonators can have other shapes besides a disk or toroid-like shapes including, but not limited to, an elliptical shape, an oval or "race track" shape, elliptical, oval and circular shapes, and various other shapes by utilizing different materials, etchants, heating/reflow temperatures, processing steps, control parameters and/or durations. This specification, however, refers to and illustrates a toroid-shaped silica sol gel micro-cavity for purposes of explanation and illustration, but not limitation.

The resulting toroid-shaped micro-cavity has smooth surfaces. For example, after the reflow processing, the toroid-shaped silica sol gel micro-cavity can have Q values exceeding $10^7$. In one embodiment, the surface finish of the toroid-shaped micro-cavity has a root mean square (rms) roughness that is similar to surface finishes of micro-sphere resonators. However, silica sol gel micro-cavity embodiments, unlike known micro-sphere resonators, provide these surface finishes and ultra-high Q values in a planar micro-resonator that can be prepared on a silicon substrate. This configuration allows the micro-cavity to be easily integrated with other components.

More particularly, in the illustrated embodiment, the micro-cavity is in the form of a ring, disk or toroid that has a periphery or outer edge 412 and an inner edge 414. An outer diameter D1 is defined by the outer edges 414, and an inner diameter D2 is defined by the inner edges 412. Portions of the silicon substrate 110 that are located below the periphery of the toroid micro-cavity 110, and an inner edge 414 of the micro-cavity extends around the outer edge of the top surface of the support member. Thus, the substrate support member effectively elevates the toroid micro-cavity 140 above the substrate 110.

Optical energy travels along an inner surface of the outer edge of the micro-cavity 140, for example, within a whispering gallery mode (WGM) or other resonant mode. A WGM is a resonate mode in which optical energy electromagnetic waves are totally internally reflected, and focused by the inner surface of the micro-cavity. Thus, the optical energy can circulate within the micro-cavity and be confined therein to provide high and ultra-high Q values.

Figure 5:
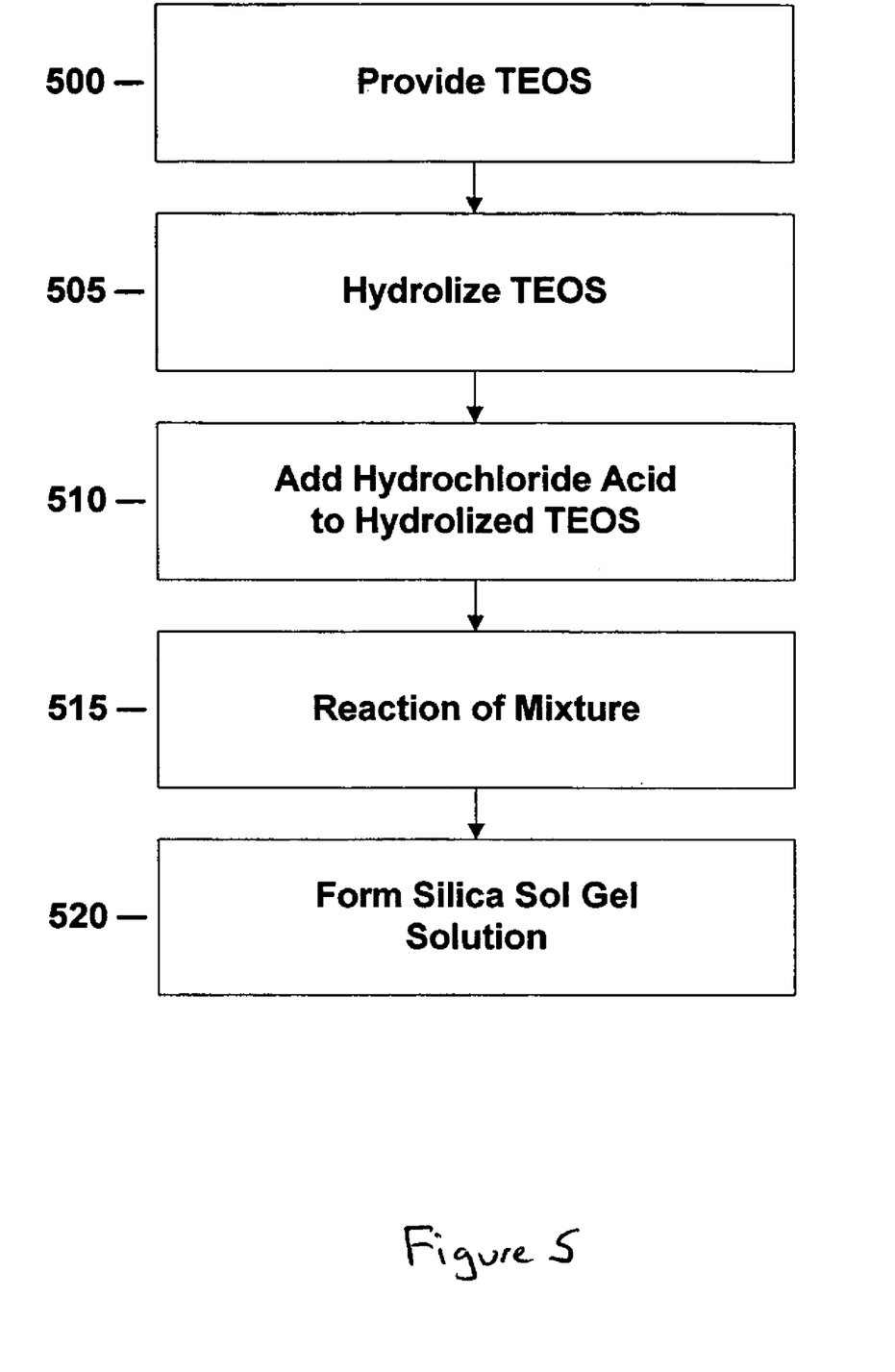
FIG. 5 is a flow chart illustrating a method of making a silica sol gel solution for fabricating silica sol gel micro-lasers.
Figure 6:
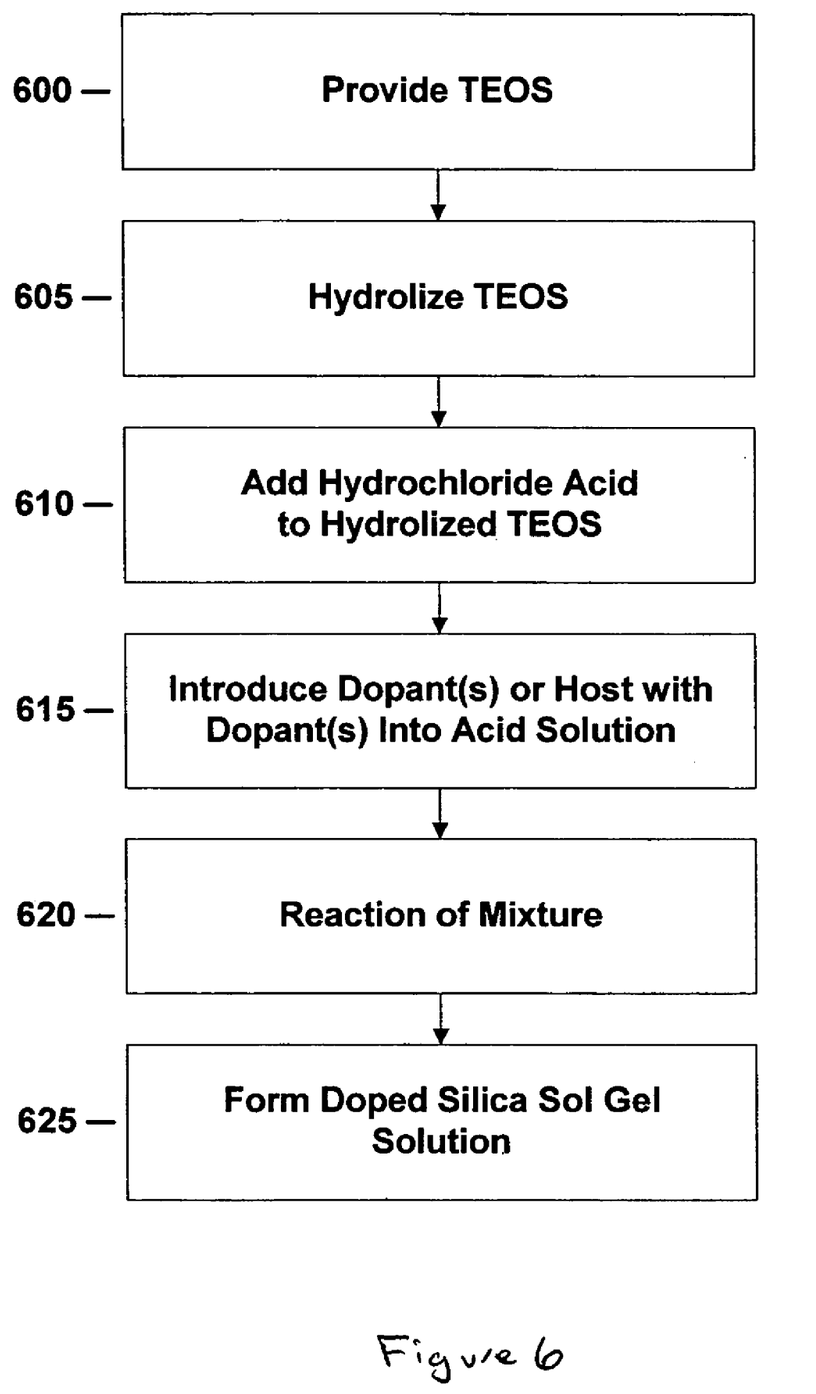
FIG. 6 is a flow chart illustrating a method of making a doped silica sol gel solution for fabricating doped silica sol gel micro-lasers.

FIGS. 5 and 6 and the following specification sections illustrate and describe methods of making a suitable silica sol gel solution and a suitable doped silica sol gel solution in further detail.

FIG. 5 illustrates one manner of preparing an undoped silica sol gel solution that can be applied to a substrate to form silica sol gel micro-cavities. In step 500, tetraethoxysilane (TEOS) is provided. One suitable TEOS is available from Alfa Aesar, 26 Parkridge Road, Ward Hill, Mass. 01835. In step 505, the TEOS is hydrolyzed. For example, TEOS can be hydrolyzed with water in which a molar ratio of water to TEOS is about 1:1 to 2:1. In step 510, hydrochloride acid is added to the hydrolyzed TEOS to provide an acid condition. For example, hydrochloride acid with a molar ratio of water to hydrochloride acid of about 2:1 to about 4:1 can be added to the hydrolyzed TEOS. In step 515, the mixture is allowed to react together, for example, at 60-80° C., preferably 70° C., for about 2-10 hours, preferably about 3 hours. In step 520, a viscous silica sol gel solution is formed.

FIG. 6 illustrates one manner of preparing a doped silica sol gel solution that can be applied to a substrate to form doped silica sol gel micro-cavities. Some of the steps shown in FIG. 6 are the same as the steps shown in FIG. 5, which shows how an undoped silica sol gel solution can be made. In step 600, tetraethoxysilane (TEOS, $Si(OC_2H_5)_4$) is provided. A host having erbium ions is also provided. For example, a host with erbium can be $Er(NO)_3$ or Erbium Nitrate. In step 605, the TEOS is hydrolyzed, as previously discussed. In step 610, hydrochloride acid is added to the hydrolyzed TEOS, as previously discussed.

In step 615, one or more dopants or a host with one or more dopants are introduced into the acid solution. The dopant can be a rare earth element, such as erbium, Nd, Yb, or a combination of Er/Yb, an organic element, or a dopant that is used to reduce a melting temperature of the sol gel can be added to the acid solution.

For example, a rare earth element can be used to provide certain optical functionality or wavelength emissions. In one embodiment, erbium provides an optical output at about 1550 nm micrometers. The concentration of $Er^{+3}$ ions can be selected so that the micro-laser operates in continuous or pulsed mode. For example, continuous mode erbium-doped silica sol gel micro-lasers can be fabricated using an $Er^{+3}$ ion concentration of $10^{18}$ to $10^{22}$ ions/$cm^3$. Higher concentrations can be used to pulse the erbium-doped silica sol gel micro-laser.

In other embodiments, dopants are used to change the melting point of the silica sol gel micro-cavity. For example, phosphorous can be added to a silica sol gel solution to reduce the melting point of the silica sol gel solution. For example, a phosphorous doped silica sol gel solution can have a melting point of about 1000°-1200° C., whereas a silicon pillar and substrate can have a melting point of about 1400° C. As a result, a substrate, such as a chip or a wafer, having phosphorous doped silica sol gel micro-cavities can be selectively heated or batch processed in a furnace at a temperature below 1400° C. so that the underlying silicon support member and substrate are not damaged. Persons skilled in the art will appreciate that various dopants and dopant combinations can be utilized. Preparation of an erbium doped silica sol gel solution is discussed in further detail for purposes of explanation, not limitation.

In step 620, the mixture is allowed to react together, for example, at 60-80° C., preferably 70° C., for about 2-10 hours, preferably about 3 hours. During the hydrolyzation process, the alkoxide groups ($OC_2H_5$) in TEOS is replaced by hydroxyl groups in the water, and subsequent condensation reactions produce siloxane bonds (O—Si—O) with the by products of water or alcohol. During the reaction involving Er ($NO_3$), the $NO_3$ decomposes so that $Er^{+3}$ ions remain in the silica sol gel solution. Thus, in step 625 a viscous silica sol gel solution is formed with $Er^{+3}$ ions. The erbium-doped silica sol gel solution can be applied to a substrate to form a coating, and erbium-doped silica sol gel micro-cavities can be formed from the coating, as previously discussed with reference to FIG. 3.

Figure 7:
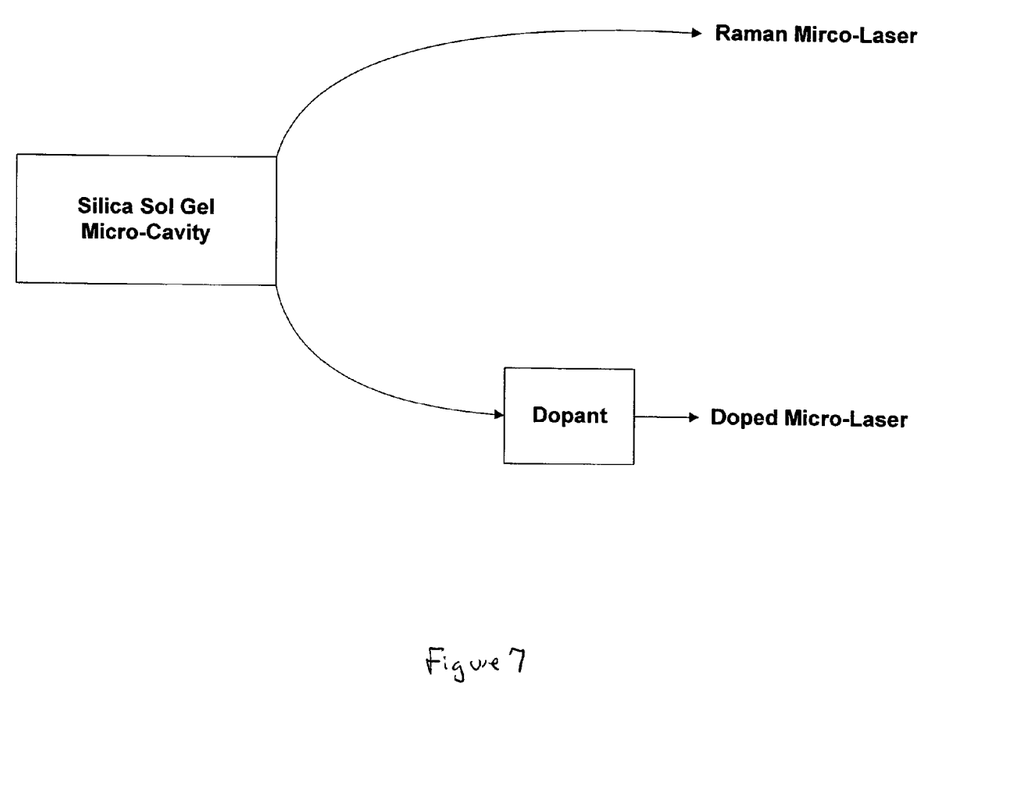
FIG. 7 shows a sol gel micro-cavity used as a Raman laser that is made from an undoped silica sol gel solution or a micro-laser made from a doped silica sol gel solution.

Referring to FIG. 7, a sol gel micro-cavity can be used as a Raman laser using an undoped silica sol gel solution (as in FIG. 5) or a doped micro-laser using a doped silica sol gel solution (as in FIG. 6).

Figure 8:
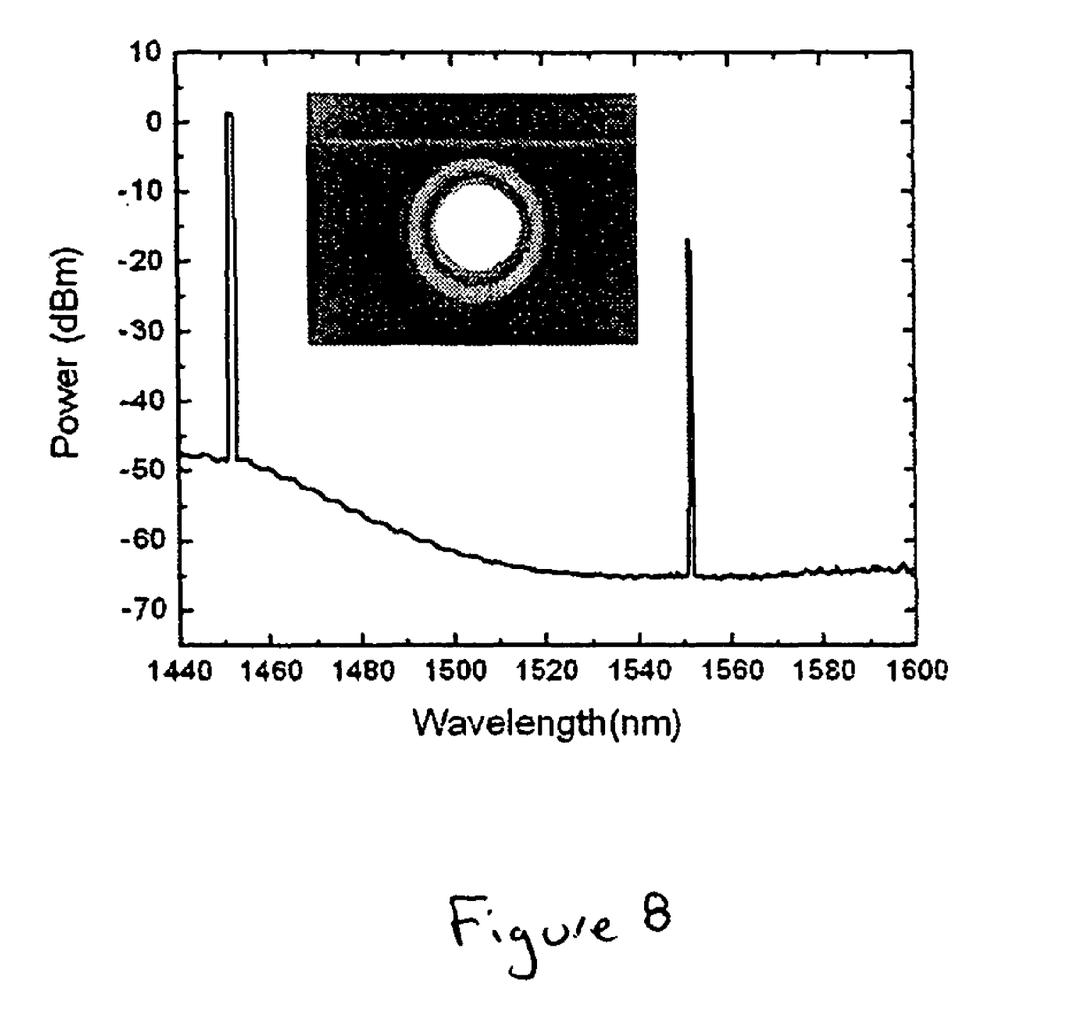
FIG. 8 is a graph illustrating an emission spectrum of a Raman microtoroid laser and an inset showing the Raman microtoroid laser coupled to a fiber taper.

FIG. 8 is a graph illustrating an emission spectrum of a Raman sol gel microtoroid laser having a principal or outer diameter of 55 micrometers. The Raman laser was made from a coating of undoped silica sol gel solution (FIG. 5). The pump power was 1.2 mW at 1451 nm. It was observed that Raman oscillation occurred at 1551 nm. The inset of FIG. 8 illustrates the sol gel microtoroid laser coupled to a fiber taper.

Figure 9:
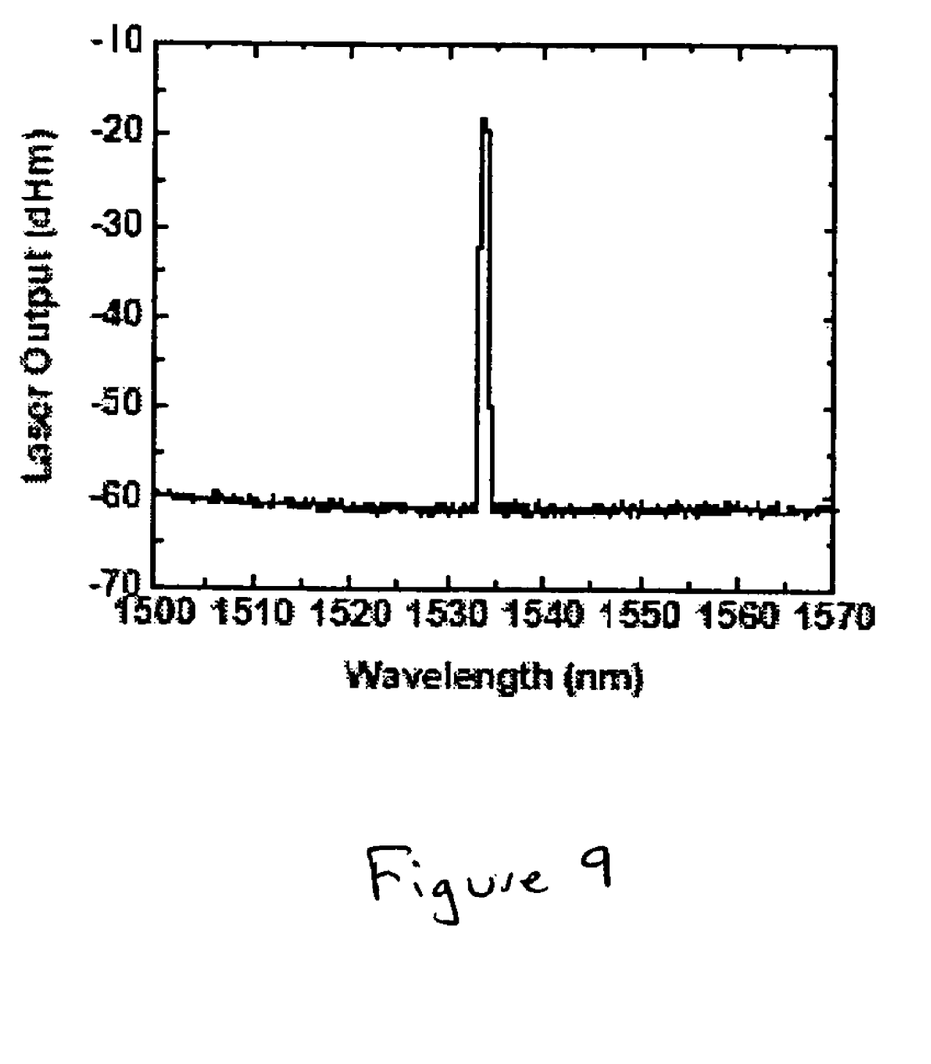
FIG. 9 is a graph illustrating an emission spectrum of an erbium-doped sol gel microtoroid laser.
Figure 10:
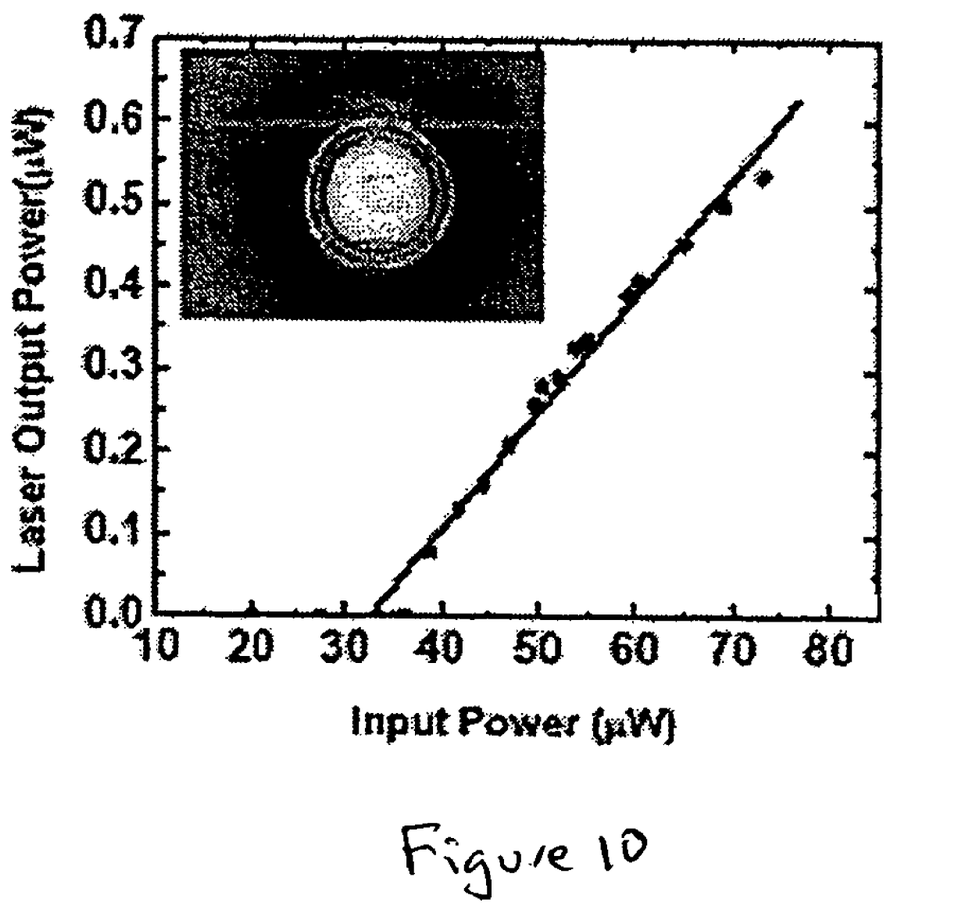
FIG. 10 is a graph illustrating measure laser output power versus absorbed pump power of an erbium-doped sol gel microtoroid laser.

A doped silica sol gel solution, e.g., an erbium-doped silica sol gel solution, can be used to form erbium-doped silica sol gel micro-resonators according to one embodiment. FIG. 9 is a graph illustrating an emission spectrum of an erbium-doped sol gel microtoroid laser. As the graph shows, the emission spectrum was at wavelengths between about 1533 nm and 1555 nm, with the laser output being about −20 dbm. FIG. 10 is a graph illustrating the measured laser output power versus absorbed pump power of an erbium-doped sol gel microtoroid laser. As FIG. 10 shows, a low pump power of about 33 microwatts was required to initiate lasing of an erbium-doped silica sol gel micro-laser. The inset of FIG. 10 illustrates an erbium-doped silica sol gel micro-toroid coupled to a fiber taper.

As can be seen from the graph of FIG. 9, embodiments are directed to erbium-doped silica sol gel micro-lasers have a useful output spectrum and achieve high and ultra high Q factors. Embodiments also provide a significant enhancement with respect to the line width of an erbium-doped silica sol gel micro-laser. For example, FIG. 9 shows that an erbium-doped silica sol gel micro-laser on a substrate, such as a chip or a wafer, is capable of having a line width on the order of hundreds of Hz. These line width values are significantly less than line widths of commercial chip-based lasers (i.e., semiconductor lasers) which typically exhibit line widths in excess of 1 MHz.

It has been confirmed that embodiments of erbium-doped silica sol gel micro-lasers have been able to achieve ultra narrow line widths ranging from 100 Hz to 1 KHz. Although these confirmed line widths are believed to represent the narrowest line widths known to date for a micro-laser on a silicon substrate, it is believed that the line width can be reduced further to tens of Hz. Accordingly, embodiments of erbium-doped silica sol gel micro-lasers provide significant enhancements relative to commercial lasers on a substrate or a chip. The embodiments of narrow or "ultra" narrow line width micro-lasers can be used in various applications, for example, as a laser source for heterodyne detection and other applications that utilize narrower line width detection.

Although references have been made in the foregoing description to various embodiments, persons skilled in the art will recognize that insubstantial modifications, alterations, and substitutions can be made to the described embodiments without departing from the invention as recited in the accompanying claims. For example, silica sol gel materials can be doped with various dopants and combinations of dopants. Further, embodiments of sol gel micro-lasers can have various emission spectra, Q factors and line widths for use with various applications.

What is claimed:

1. A sol gel micro-cavity resonator, comprising:
   a micro-cavity substantially comprising sol gel throughout, the micro-cavity being planar and having a Q factor greater than about $10^7$;
   a substrate; and
   a support member, the support member extending between the sol gel micro-cavity and the substrate, an outer periphery surface of the sol gel micro-cavity extending beyond a top of the support member, and optical energy traveling along an inner surface of the sol gel micro-cavity.

2. The resonator of claim 1, the sol gel micro-cavity having a toroid shape.

3. The resonator of claim 1, the sol gel micro-cavity having a diameter of about 30 micrometers to about 100 micrometers.

4. The resonator of claim 1, the outer surface of the sol gel micro-cavity extending beyond the top of the support by about 10 micrometers to about 40 micrometers.

5. The resonator of claim 1, the sol gel micro-cavity being substantially parallel to the top of the support.

6. The resonator of claim 1, a resonant mode within the sol gel micro-cavity comprising a whispering-gallery mode.

7. The resonator of claim 1, the support member having a tapered shape.

8. The resonator of claim 1, the support member being isotropically shaped.

9. The resonator of claim 1, the support member being substantially perpendicular to a plane defined by the sol gel micro-cavity.

10. The resonator of claim 1, the support member and the substrate being the same material.

11. The resonator of claim 1, the sol gel micro-cavity including a dopant.

12. The resonator of claim 11, the dopant comprising a material that reduces a melting point of the sol gel micro-cavity.

13. The resonator of claim 12, the doped sol gel micro-cavity having a melting point that is lower than a melting point of the support member and the substrate.

14. The resonator of claim 12, the melting point reduction dopant comprising phosphorous.

15. The resonator of claim 14, the phosphorous doped sol gel micro-cavity having a melting point of about 1000° C.

16. The resonator of claim 11, the dopant comprising a rare Earth dopant.

17. The resonator of claim 16, wherein the rare Earth dopant is erbium.

18. The resonator of claim 17, the erbium doped sol gel micro-cavity having an optical output from about 1530 nm to about 1600 nm.

19. The resonator of claim 17, the erbium doped sol gel micro-cavity having a line width of 1000 Hz or less.

20. The resonator of claim 19, the erbium doped sol gel micro-cavity having a line width of about 100 Hz or less.

21. The resonator of claim 16, wherein the rare earth dopant is neodymium, ytterbium, or a combination of erbium and ytterbium.

22. The resonator of claim 11, the dopant comprising an organic molecule.

23. The resonator of claim 1, the sol gel micro-cavity comprising a Raman laser.

24. The resonator of claim 23, the Raman laser having an emission at about 1550 nm.

25. The resonator of claim 1, at least a portion of the outer periphery of the sol gel micro-cavity being selectively heated and reflowed.

26. An ultra narrow line width micro-laser on a chip or a wafer, comprising:
    a micro-cavity substantially comprising sol gel throughout, the micro-cavity being planar;
    a dopant, wherein the sol gel micro-cavity includes the dopant, and the doped sol gel micro-cavity having a Q factor greater than about $10^7$;
    a silicon substrate; and
    a support member, the support member extending between the doped sol gel micro-cavity and the silicon substrate, optical energy traveling along an inner surface of the doped sol gel micro-cavity and having a line width less than 1000 Hz.

27. The micro-laser of claim 26, the doped sol gel micro-cavity having a toroid shape.

28. The resonator of claim 26, the doped sol gel micro-cavity having a diameter of about 30 micrometers to about 100 micrometers.

29. The resonator of claim 26, an outer surface of the doped sol gel micro-cavity extending beyond a top of the support member by about 10 micrometers to about 40 micrometers.

30. The micro-laser of claim 26, the doped sol gel micro-cavity being substantially parallel to the top of the support member.

31. The micro-laser of claim 26, a resonant mode within the doped sol gel micro-cavity comprising a whispering-gallery mode (WGM).

32. The micro-laser of claim 26, the support member having a tapered shape.

33. The micro-laser of claim 26, the support member being isotropically shaped.

34. The micro-laser of claim 26, the support member being substantially perpendicular to a plane defined by the silicon substrate and a plane defined by the doped sol gel micro-cavity.

35. The micro-laser of claim 26, the support member and the substrate being the same material.

36. The micro-laser of claim 26, the dopant comprising a rare Earth dopant.

37. The micro-laser of claim 36, wherein the rare Earth dopant is erbium.

38. The micro-laser of claim 37, the erbium doped sol gel micro-cavity having an optical output from about 1530 nm to about 1600 nm.

39. The resonator of claim 37, the erbium doped sol gel micro-cavity having a line width of about 100 Hz or less.

40. The resonator of claim 36, wherein the rare earth dopant is neodymium, ytterbium, or a combination of erbium and ytterbium.

41. The micro-laser of claim 36, further comprising a dopant that reduces a melting point of the sol gel micro-cavity.

42. The micro-laser of claim 41, the doped sol gel micro-cavity having a melting point that is lower than a melting point of the support member and the substrate.

43. The micro-laser of claim 41, the melting point reduction dopant comprising phosphorous.

44. The micro-laser of claim 43, the phosphorous doped sol gel micro-cavity having a melting point of about 1000° C.

45. The micro-laser of claim 36, further comprising an organic molecule dopant.

46. The micro-laser of claim 26, at least a portion of the outer periphery of the doped sol gel micro-cavity being annealed.

47. The micro-laser of claim 26, at least a portion of the outer periphery of the doped sol gel micro-cavity being selectively heated and reflowed.

* * * * *